(12) United States Patent
Yan

(10) Patent No.: US 7,473,933 B2
(45) Date of Patent: Jan. 6, 2009

(54) HIGH POWER LED PACKAGE WITH UNIVERSAL BONDING PADS AND INTERCONNECT ARRANGEMENT

(75) Inventor: Xiantao Yan, San Jose, CA (US)

(73) Assignee: LedEngin, Inc. (Cayman), Grand Cayman (KY)

( * ) Notice: Subject to any disclaimer, the term of this patent is extended or adjusted under 35 U.S.C. 154(b) by 108 days.

(21) Appl. No.: 11/259,842

(22) Filed: Oct. 26, 2005

(65) Prior Publication Data

US 2006/0091416 A1 May 4, 2006

Related U.S. Application Data

(60) Provisional application No. 60/623,266, filed on Oct. 29, 2004, provisional application No. 60/623,171, filed on Oct. 29, 2004, provisional application No. 60/623,260, filed on Oct. 29, 2004.

(51) Int. Cl.
*H01L 29/18* (2006.01)
*H01L 33/00* (2006.01)

(52) U.S. Cl. .................... 257/88; 257/99; 257/100; 257/E33.056

(58) Field of Classification Search ............... 257/99, 257/E25.004, E25.019
See application file for complete search history.

(56) References Cited

U.S. PATENT DOCUMENTS

| | | | |
|---|---|---|---|
| 5,959,316 | A | 9/1999 | Lowery |
| 6,307,160 | B1 | 10/2001 | Mei et al. |
| 6,608,332 | B2 | 8/2003 | Shimizu et al. |
| 6,614,179 | B1 | 9/2003 | Shimizu et al. |
| 6,642,652 | B2 | 11/2003 | Collins, III et al. |
| 6,680,128 | B2 | 1/2004 | Mei |
| 6,791,116 | B2 | 9/2004 | Takahashi et al. |
| 6,828,170 | B2 | 12/2004 | Roberts |
| 7,064,353 | B2 * | 6/2006 | Bhat ............ 257/79 |
| 7,156,538 | B2 | 1/2007 | Han et al. |
| 7,157,744 | B2 | 1/2007 | Palmteer et al. |
| 7,168,608 | B2 | 1/2007 | Mei |
| 7,199,446 | B1 | 4/2007 | Mei et al. |
| 7,264,378 | B2 | 9/2007 | Loh |
| 2001/0015778 | A1 | 8/2001 | Murade |

(Continued)

OTHER PUBLICATIONS

"Solvent Soluble Polyimide with High Transparency and High Tg: HOP-400, 500", Hitachi Cable Review, Aug. 2003, No. 22, p. 78.

(Continued)

*Primary Examiner*—Jerome Jackson, Jr.
*Assistant Examiner*—Anthony Ho
(74) *Attorney, Agent, or Firm*—Carr & Ferrell LLP

(57) ABSTRACT

LED packages are provided that can accommodate more than one type of LED. These packages include at least three bonding pads arranged such that two are appropriate for one type of LED, while another two are appropriate for another type of LED. Packages can include a thermally conductive layer on which the bonding pads and associated traces are disposed. The packages can also include electrical contacts on either of their top or bottom surfaces that are electrically coupled to the bonding pads by metallized vias or partial vias defined along edges or corners of the packages. Packages for multiple LEDs are also provided. These packages can enable the LEDs to be selectively operable.

11 Claims, 9 Drawing Sheets

U.S. PATENT DOCUMENTS

| | | |
|---|---|---|
| 2002/0163006 A1 | 11/2002 | Yoganandan et al. |
| 2002/0191885 A1* | 12/2002 | Wu et al. |
| 2003/0016899 A1 | 1/2003 | Yan |
| 2003/0086674 A1 | 5/2003 | Yan et al. |
| 2003/0116769 A1 | 6/2003 | Song et al. |
| 2004/0079957 A1 | 4/2004 | Andrews et al. |
| 2004/0102061 A1 | 5/2004 | Watanabe |
| 2004/0201025 A1 | 10/2004 | Barnett |
| 2004/0257496 A1 | 12/2004 | Sonoda |
| 2005/0093146 A1 | 5/2005 | Sakano |
| 2005/0179376 A1 | 8/2005 | Fung et al. |
| 2005/0224830 A1 | 10/2005 | Blonder et al. |
| 2006/0012299 A1* | 1/2006 | Suehiro et al. ............... 313/512 |
| 2006/0063287 A1 | 3/2006 | Andrews |
| 2006/0082296 A1 | 4/2006 | Chua et al. |
| 2006/0097385 A1 | 5/2006 | Negley |
| 2006/0170332 A1 | 8/2006 | Tamaki et al. |

OTHER PUBLICATIONS

U.S. Appl. No. 11/260,101, Xiantao Yan, Method of Manufacturing Ceramic LED Packages, Oct. 26, 2005.

U.S. Appl. No. 11/259,818, Xiantao Yan, LED Package with Structure and Materials for High Heat Dissipation, Oct. 26, 2005.

U.S. Appl. No. 11/036,559, Xiantao Yan, Light Emitting Device with a Thermal Insulating and Refractive Index Matching Material, Jan. 13, 2005.

Yan, Xiantao et al., Two Test Specimens for Determining the Interfacial Fracture Toughness in Flip-Chip Assemblies, Transactions of the ASME, vol. 120, Jun. 1998, p. 150.

Yan, Xiantao, Analysis Based Design Guidelines for Metal Runner and Passivation Layers in IC Packaging, Delphi Automotive Systems Analytical Engineering Conference, May 2000, p. 1.

Kading, thermal conduction in metallized silicon-dioxide layers on silicon, Appl. Phys. Lett 65, 1994, pp. 1629-1631.

U.S. Appl. No. 11/796,240, filed Apr. 27, 2007, LED Packages with Mushroom Shaped Lenses and Methods of Manufacturing LED Light-Emitting Devices, Xiantao Yan.

U.S. Appl. No. 11/824,233, filed Jun. 29, 2007, Matrix Material Including an Embedded Dispersion of Beads for a Light-Emitting Device, Xiantao Yan.

* cited by examiner

HIGH POWER LED PACKAGE WITH UNIVERSAL BONDING PADS AND INTERCONNECT ARRANGEMENT

CROSS-REFERENCE TO RELATED APPLICATIONS

The application claims the benefit of U.S. Provisional Patent Application No. 60/623,266 entitled "1-5 Watt and Higher LED Packages," U.S. Provisional Patent Application No. 60/623,171 entitled "3-10 Watt and Higher LED Packages," and U.S. Provisional Patent Application No. 60/623,260 entitled "5-15 Watt and Higher LED Packages," each filed on Oct. 29, 2004 and each incorporated herein by reference in its entirety. The application is related to U.S. patent application Ser. No. 11/259,818 entitled "LED Package with Structure and Materials for High Heat Dissipation," and U.S. patent application Ser. No. 11/260,101 entitled "Method of Manufacturing Ceramic LED Packages," both filed on even date herewith. The application is also related to U.S. patent application Ser. No. 11/036,559 filed on Jan. 13, 2005 and entitled "Light Emitting Device with a Thermal Insulating and Refractive Index Matching Material," which is incorporated by reference herein.

BACKGROUND OF THE INVENTION

1. Field of the Invention

The present disclosure relates generally to light emitting diodes and more particularly to packages for high-power LEDs.

2. Description of the Prior Art

A light emitting diode (LED) is a semiconductor device that produces light when an electric current is passed therethrough. LEDs have many advantages over other lighting sources including compactness, very low weight, inexpensive and simple manufacturing, freedom from burn-out problems, high vibration resistance, and an ability to endure frequent repetitive operations. In addition to having widespread applications for electronic products as indicator lights and so forth, LEDs also have become an important alternative light source for various applications where incandescent and fluorescent lamps have traditionally predominated.

Using phosphors as light "converters," LEDs can also serve to produce white light. In a typical LED-based white light producing device, a monochromatic LED is encapsulated by a transparent material containing appropriate phosphors. In some systems, an LED that produces a monochromatic visible light is encapsulated by a material containing a compensatory phosphor. The wavelength(s) of the light emitted from the compensatory phosphor is compensatory to the wavelength of the light emitted by the LED such that the wavelengths from the LED and the compensatory phosphor mix together to produce white light. For instance, a blue LED-based white light source produces white light by using a blue light LED and a phosphor that emits a yellowish light when excited by the blue light emitted from the LED. In these devices the amount of the phosphor in the transparent material is carefully controlled such that only a fraction of the blue light is absorbed by the phosphor while the remainder passes unabsorbed. The yellowish light and the unabsorbed blue light mix to produce white light. Another exemplary scheme uses an LED that produces light outside of the visible spectrum, such as ultraviolet (UV) light, together with a mixture of phosphors capable of producing either red, green, or blue light when excited. In this scheme, the light emitted by the LED only serves to excite the phosphors and does not contribute to the final color balance.

Recent advances in semiconductor technology have made it possible to manufacture high-power LEDs that produce light at selected wavelengths across the visible spectrum (400-700 nm). Such high-power LEDs can have reliability and cost advantages over existing technologies such as incandescent lamps, arc lamps, and fluorescent lamps in many lighting applications. High-power LEDs also offer advantages for design of next generation color display technologies such as active matrix thin film transistor liquid crystal displays (TFTLCDs) in applications such as consumer computer and television monitors, projection TVs, and large advertising displays.

Although high-power LED devices have been manufactured, their widespread use has been limited because of a lack of suitable packages for the LEDs. Current LED packages cannot handle the high-power density of LED chips. In particular, prior art packages provide inadequate heat dissipation away from the LED dies. Inadequate heat dissipation limits the minimum size of the package and therefore the density of LEDs per unit area in the device. One measure of how efficiently a package dissipates heat is the temperature rise across the package for a given input electrical power. This measure is generally in the range of 15 to 20 degrees centigrade per watt (° C./W) from the junction to the case in current LED packages, usually too high to provide adequate heat dissipation for an LED package having a power higher than 1 watt.

Without sufficient heat dissipation, devices incorporating high-powered LEDs can run very hot. Light output, LED efficiency, and LED life, are each dependent on the LED die junction temperature. Inadequate heat dissipation will cause the LED Die to operate at a higher temperature and therefore limits the performance of the LED die when the LED die is capable of operating at a power level exceeding the limits of the package. Insufficient heat dissipation by an LED package can cause the LED device to fail at an early stage or render it too hot to use safely.

Even under less severe conditions, inadequate heat conduction for an LED package may result in poor thermal stability of the phosphors, as well as encapsulation and lens materials, in those devices that employ phosphors. Specifically, exposure to high temperatures for extended periods tends to alter the chemical and physical properties of such phosphors, encapsulation, and lens materials, causing performance deterioration. For instance, the light conversion efficiency can decline and the wavelength of output light can shift, both altering the balance of the light mixture and potentially diminishing the intensity of the overall output. For example, currently available phosphors are often based on oxide or sulfide host lattices including certain rare earth ions. Under prolonged high temperature conditions, these lattices decompose and change their optical behavior. Other problems commonly found with LED-based white light sources are transient color changes and uneven color distributions, both caused by temperature gradients in the phosphor-containing material and degradation of the encapsulation and lens materials. Such behaviors often create an unsatisfactory illumination. The above-mentioned thermal problems worsen with increasing temperature and therefore are particularly severe for devices that incorporate high-power LEDs with phosphors.

Attempts have been made in current LED packages to alleviate the above problem. One example is to directly attach an LED die to a top surface of a metal heat slug such as a copper plate. The copper plate serves to spread the heat and to make electrical connections with the LED die. This design limits the selection of materials for the heat slug because the design relies at least partially on the conductive nature of the copper for making the conductive contacts between the LED die and the top surface of the copper heat slug. The use of copper heat slugs also has other limitations, such as a substantial mismatch between the coefficients of thermal expansion (CTE) of the LED die material and the copper onto which the LED die is attached. A large CTE mismatch can create high stresses upon heating a cooling at bonded interfaces. Cracks that form at these interfaces then render the LED package unreliable. In addition, the above design is relatively expensive and difficult to manufacture.

Given the importance of LEDs as light sources, particularly high-power LEDs, there is a need for improved LED packaging methods and materials to alleviate the above-identified problems by providing better thermal performance (e.g., improved thermal resistance from junction to case) and higher reliabilities (e.g., lower stresses in packaging materials). Such packaging methods and materials will allow LEDs to produce higher optical performance (Lumens/package) from a smaller package or footprint (Lumens/area), which are critical for many light source applications.

SUMMARY

The present disclosure addresses the above problems by providing a package for an LED. An exemplary embodiment of the package is a universal LED package for accommodating different LED types, such as vertical, flip-chip, and planar LEDs from a variety of manufacturers. In this embodiment the universal LED package comprises a body including top and bottom surfaces, a cavity extending from the top surface towards the bottom surface and having a floor that is substantially parallel to the bottom surface, and first, second, and third electrically conductive bonding pads disposed on the floor of the cavity. The first and second bonding pads are arranged to provide electrical contacts for a first LED type, and the first and third bonding pads are arranged to provide electrical contacts for a second LED type. In some embodiments, one of the electrically conductive bonding pads is centrally located on the floor within the cavity.

In further embodiments, the package also comprises an electrical path, including such features as traces and vias, connecting the first pad to an exterior contact disposed, for example, on a top or bottom surface of the body. The electrical path can include a metallized partial via disposed on an edge or corner of the body.

Another exemplary embodiment is an LED package comprising a body including top and bottom surfaces, a cavity extending from the top surface towards the bottom surface and having a floor that is substantially parallel to the bottom surface, and first and second electrically conductive bonding pads disposed on the floor of the cavity. The first and second bonding pads are configured to completely cover the floor of the cavity except for a narrow gap therebetween. Since the bonding pads substantially cover the floor of the cavity, the floor is made to be highly reflective. The body further includes, in some of these embodiments, a top body layer disposed above the ceramic layer. In these embodiments the cavity is disposed through the top body layer. Also, in some of these embodiments the top body layer also comprises a ceramic.

Yet another exemplary embodiment is an LED package for multiple LEDs. This package comprises a body including top and bottom surfaces, a cavity extending from the top surface towards the bottom surface and having a floor that is substantially parallel to the bottom surface, a thermally conducting material disposed between the floor and the bottom surface, a plurality of LED bonding pads disposed on the floor, and a plurality of electrical bonding pads disposed on the floor proximate to the LED bonding pads and in electrical communication with a plurality of electrical contacts disposed on a surface of the body. In various of these embodiments, the thermally conducting material can comprise a ceramic, and the plurality of LED bonding pads are non-electrically conductive. The plurality of electrical contacts can also be disposed on the top or bottom surface of the body, and the plurality of electrical bonding pads can be in electrical communication with the plurality of electrical contacts through a plurality of vias, which can be partial vias. The package can also comprise an ESD protection device coupled between two of the plurality of electrical bonding pads.

Light emitting devices are also provided that comprise a package and one or more LEDs. In one such embodiment, the package includes top and bottom surfaces, a cavity extending from the top surface towards the bottom surface and having a floor that is substantially parallel to the bottom surface, a thermally conducting material disposed between the floor and the bottom surface, a plurality of LED bonding pads disposed on the floor, and a plurality of electrical bonding pads disposed on the floor proximate to the LED bonding pads and in electrical communication with a plurality of electrical contacts disposed on a surface of the body. In the embodiment a plurality of LED dies disposed on the plurality of LED bonding pads and electrically coupled to the plurality of electrical bonding pads. In various further embodiments the LED dies are electrically connected in series or selectively operable. The plurality of LED bonding pads can be electrically conductive. The light emitting device can also comprise a luminescent layer disposed over the LED dies, and a thermal insulation layer between the luminescent layer and the LED dies.

DETAILED DESCRIPTION OF THE DISCLOSURE

1. An Overview

Figure 1:
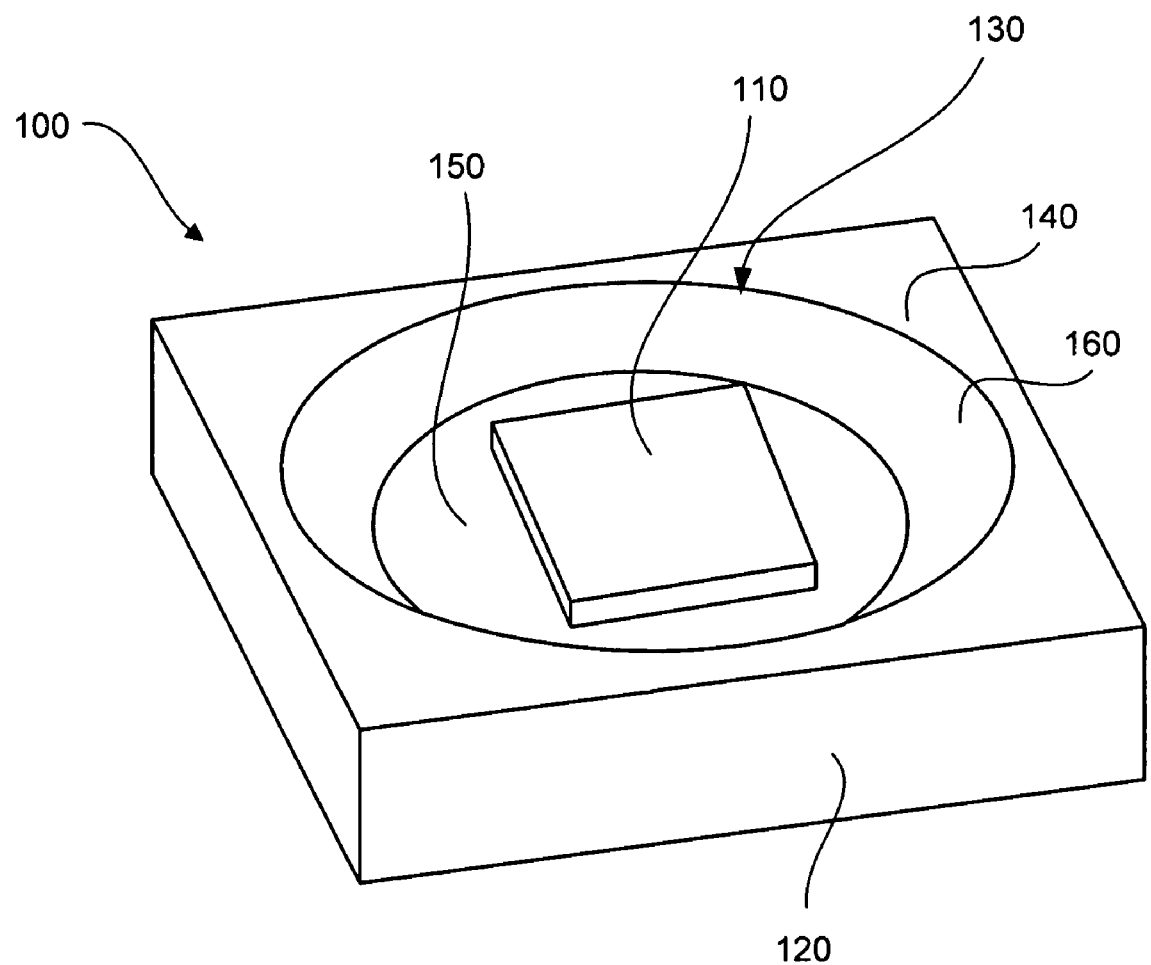
FIG. 1 is a perspective view of an LED die bonded to an exemplary LED package according to an embodiment of the present disclosure.

The present disclosure provides LED packages with structures and materials that provide higher heat dissipation than presently available. A further benefit of the present invention is improved matching of the coefficients of thermal expansion (CTEs) of the LED dies and the materials to which they are bonded for higher reliability. Due to the improved heat conduction, the packages of the present invention allow high-power LEDs to operate at full capacity. Improved heat conduction also allows for both smaller packages and devices within which packages are placed more closely together.

One measure of how efficiently a package dissipates heat is the temperature rise across the package. Using this measure, in current high-power LED packages the thermal resistance from the junction to the case is generally in the range of 15 to 20° C./W. By comparison, an exemplary embodiment of the present disclosure has a lower thermal resistance of only about 6° C./W or 3° C./W for a four LED dice package. Therefore, the present disclosure enables LED devices for new applications in both high temperature environments (such as in an automobile engine compartment) and also in environments that cannot accommodate high temperature components (such as a dental curing light for use in a patient's mouth).

Accordingly, exemplary packages for high-power LEDs according to the present disclosure have the following features: 1) They offer higher performance by enabling 50% or greater luminosity per LED die as compared to prior art packages; 2) they provide a high thermal conductivity path to conduct heat away from LED dies; 3) they redirect light emitted at low solid angles (tangential light) into directions more nearly perpendicular to the surface of the LED die; and 4) they provide a material layer, for bonding to the LED die, having a CTE that is closely matched to the CTE of the LED die to minimize interfacial stresses and improve reliability.

The present disclosure provides embodiments for a package for a single high-power LED die in the 1 to 7 watt output power range that provides the desirable features discussed above. The present disclosure also provides embodiments to stabilize the wavelength (i.e., color) of LED dies. In the case of white LED applications, the present disclosure provides embodiments for improving white light LED efficiency.

The present disclosure also provides embodiments for a package for multiple high-power LED dies with a combined output in the 1 to 15 watt output power range. These packages have very small form factors and can be fabricated at low cost. The small form factors enable the design of light source optics with more compact sizes. Therefore, the present invention enables a new class of high-power LED-based light source and display applications to emerge.

The packages of the present invention can be used with LED devices that operate over the range of wavelengths from ultraviolet (UV) to Infrared (IR) which covers the range from 200 to 2000 nanometers. Further, packages of the present invention can include bonding pads configured to accommodate any of a number of different LED die designs that are presently available in the market. The present disclosure, in some embodiments, also provides a versatile package design whereby the thermal and electrical paths are separated. In this way, the package can be attached to a heat sink of a circuit board using either a thermally and electrically conductive epoxy or solder, or a thermally conductive and electrically non-conductive epoxy.

2. Exemplary Embodiments

FIG. 1 is a perspective view of an exemplary LED package 100 according to an embodiment of the invention. To form a light emitted device, a die 110 is bonded to the LED package 100 as shown. The LED package 100 comprises a body 120 having a cavity 130 extending downward from a top surface 140 thereof. The cavity 130 includes a floor 150 for bonding to the LED die 110. In some embodiments, the LED package 100 has a square footprint enabling multiple light emitting devices to be densely arranged in a square array. The LED package 100 is intended primarily for LED dies that produce 1-5 watts of power, but is not limited thereto.

In the embodiment shown in FIG. 1, a sidewall 160 of the cavity 130 is inclined at an angle so that the cavity 130 takes the shape of an inverted and truncated cone. The sidewall can also be vertical, or nearly so. In some embodiments the sidewall 160 of the cavity 130 is inclined at a 45° angle. Preferably, the sidewall 160 is highly reflective at a wavelength emitted by the LED die 110. This can be achieved, for example, with a coating of a highly reflective material such as silver, though other materials can be used, depending on the wavelength of the light produced by the LED die 110. Thus, the sidewall 160 can serve to redirect light emitted from the edges of the LED die 110. The light from the edges of the LED die 110 is redirected in a direction perpendicular to a top surface of the LED die 110 so that the light emitted from the side surfaces of the LED die 110 adds to the light emitted from the top surface of the LED die 110. In other embodiments the sidewall 160 takes a parabolic shape to better focus the redirected light.

Figure 2:
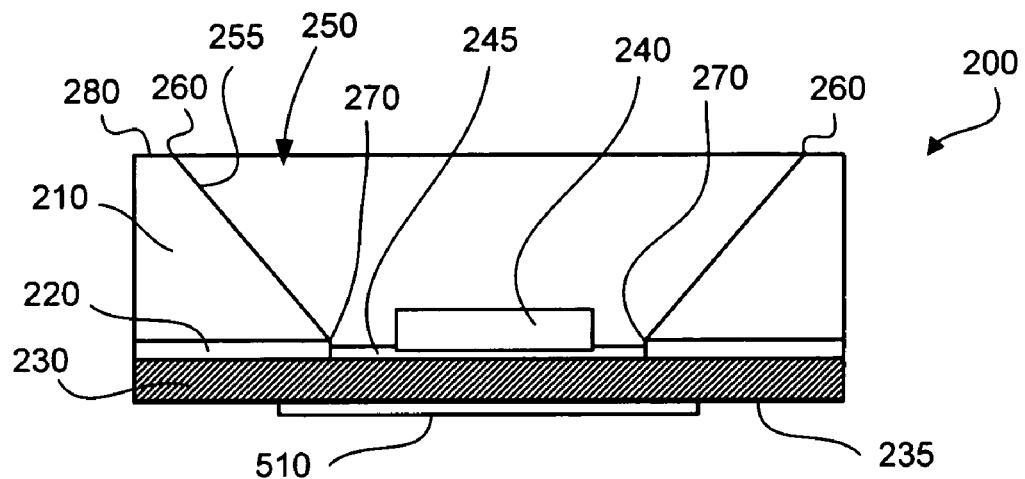
FIG. 2 is a cross-sectional view of an exemplary embodiment of the LED package of the present disclosure.

FIG. 2 is a cross-sectional view of one exemplary embodiment of an LED package 200 of the present disclosure. It can be seen from FIG. 2 that the LED package 200 comprises three layers (embodiments with four layers are described elsewhere herein) designated from top to bottom as a top body layer 210, an intermediate body layer 220 and a thermal conduction layer 230. The thermal conduction layer 230 has a bottom surface 235. An LED die 240 can be bonded to a top surface of thermal conduction layer 230 within a cavity 250 formed through layers 210 and 220. A thickness of intermediate body layer 220 is designed to be approximately the same as a thickness of a die attach layer 245 that bonds the LED die 240 to the thermal conduction layer 230. Also, in some embodiments a metallization layer on a sidewall 255 of the top body layer 210 extends from a top rim 260 at a top surface 280 of the top layer 210 to a bottom rim 270 near a bottom surface of the top body layer 210.

Figure 3:
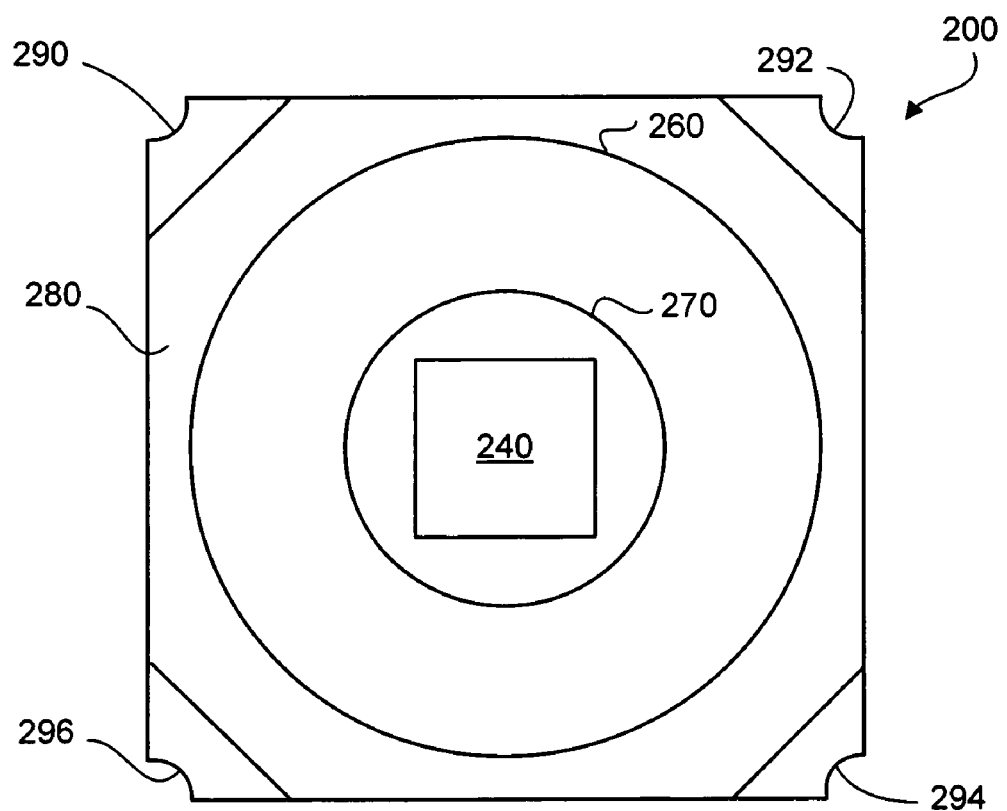
FIG. 3 is a top view of an exemplary LED package of the present disclosure.

FIG. 3 is a top view of the exemplary LED package 200 of FIG. 2. The top rim 260 and the bottom rim 270 correspond to the outer diameter and the inner diameter of the cavity 250 and are represented by two circles 260 and 270, respectively. It can be seen that the LED die 240 is positioned within the inner diameter 270. This embodiment also includes partial vias 290, 292, 294, and 296, one at each of the four corners of the LED package 200. As used herein, a partial via is a via defined at an edge or a corner of the LED package 200 and therefore appears as a half-circle or quarter-circle. The partial vias 290, 292, 294, and 296 are metallized, in some embodiments, to serve as electrical paths between electrical contacts and traces on the surfaces of the layers 210, 220, and 230. It will be appreciated that the partial vias 290, 292, 294, and 296 are conveniently formed and metallized by fabrication methods discussed below in connection with FIG. 8, however, standard (e.g. full-circle) metallized vias defined through the layers 210, 220, and 230 can also be employed for making such electrical connections.

The thermal conduction layer 230 includes a thermally conductive material, which preferably has a thermal conductivity greater than about 14 W/m° K., and more preferably has a thermal conductivity greater than 150 W/m° K. Depending on applications, power density, desired package size and thickness of the several layers, a variety of thermally conductive materials can be used to form the thermal conduction layer 230. Such materials include, but are not limited to, aluminum nitride (AlN), alumina ($Al_2O_3$), Alloy 42, copper (Cu), copper-tungsten (Cu/W) alloy, aluminum silicon carbide, diamond, graphite, and beryllium oxide. In addition to thermal conductivity, the coefficient of thermal expansion (CTE), the fracture toughness, Young's modulus, and cost are other parameters to be considered in selecting the material for the thermal conduction layer 230.

Matching the CTE of the thermally conductive material with that of the LED die reduces interfacial stresses and therefore improves reliability. Preferably, the CTE of the thermally conductive material should be less than 15 parts per million per degree centigrade (ppm/° C.) in order to more closely match the CTE of typical LED die materials such as silicon. The mismatch in the CTEs between the LED package and the LED die according to embodiments of the present disclosure is about 4.7:3, whereas for prior art packages the best ratios are about 17:3. Improved heat dissipation allows packages of the present disclosure to have a smaller footprint and to be thinner than prior art packages. An exemplary embodiment of the present disclosure has dimensions of 4.4 mm×4.4 mm×0.9 mm vs. prior art packages that measure 14 mm×7 mm×2.5 mm.

The thermal conduction layer 230, with the help of layers 210 and 220 in some embodiments, dissipates much of the heat generated by the LED 240. For applications that demand the highest thermal dissipation capabilities, each of the three layers 210, 220, and 230 comprise ceramic AlN. AlN is desirable because it combines high thermal conductivity with a CTE that is very similar to that of LED substrate materials, such as SiC, sapphire, or silicon, the material from which solid-state LEDs are most frequently fabricated. However, $Al_2O_3$ can also be used for these layers for other applications. For some applications, thermal conduction layer 230 is made from either AlN or $Al_2O_3$ while layers 210 and 220 are made of other suitable materials including plastics and metals such as copper, aluminum, and Alloy 42. For some applications it is desirable to use the thermal conduction layer 230 as the primary thermal conduction path away from the LED die 240 in order to prevent heat from being directed towards the top of the package 200. For example, it may be desirable to keep the top of the light emitting device cool to the touch.

It will be appreciated that the package 200 does not need to be formed from three layers as illustrated by FIG. 2; more or fewer layers also can be used. For example, an embodiment with four layers is also described herein. Ceramic processing techniques can also be used to form the body as an integral unit. However, a layered configuration is desirable for the ease of fabrication. For some applications with secondary lenses, layers 210 and 220 are optional.

It will be appreciated that heat produced by the LED die 240 is dissipated from the package 200 primarily through the thermal conduction layer 230. Consequently, layer 230 preferably has a thickness that is optimized for thermal conductivity therethrough. It has been found that for a given material, the thermal conductivity decreases if layer 230 is either too thin or too thick and, accordingly, there is an optimal thickness for optimal thermal conductivity. In the embodiment where AlN ceramic is used for a thermal conduction layer 230, the optimal thickness of layer 230 is in a range of 0.2 mm to 0.4 mm, and ideally about 0.3 mm.

It will be appreciated that the LED package 200 may be further attached to a heat sink (not shown) along the bottom surface 235. In addition, to optimize heat dissipation from the package 200 to the heat sink, the die attach layer 245 is preferably also thermally conductive. In the present disclosure, for a thin layer to be characterized as being thermally conductive, the material of the layer should have a thermal conductivity of at least 0.5 W/m° K., and ideally about 50 W/m° K.

In some embodiments, the thermal conductivity of the die attach layer 245 is desirably at least 1 W/m° K. The die attach layer 245 can comprise, for example, an electrically conductive epoxy, a solder, a thermally conductive and electrically non-conductive epoxy, or a nano-carbon-fiber filled adhesive. In some embodiments as discussed below, where the LED die 240 needs to make an electrical connection with the thermal conduction layer 230 through a central pad, the die attach layer 245 is also electrically conductive. In this disclosure, a thin layer material is considered to be electrically conductive if it has a volume resistivity less than $1 \times 10^{-2}$ ohm-meter. A material for an electrically conductive die attach layer 245 desirably has a volume resistivity less than $1 \times 10^{-4}$ ohm-meter.

The thermal conduction layer 230, in accordance with the present disclosure, may be either electrically conductive or electrically nonconductive. As described below, where the thermal conduction layer 230 is electrically nonconductive, the present disclosure uses a metallization pattern for the top surface of the thermal conduction layer 230 to provide necessary electrical contacts. This unique design makes it possible to fabricate the thermal conduction layer 230 from thermally conductive materials that are not electrically conductive, such as ceramics. Electrically nonconductive materials have conventionally been considered unsuitable for making heat slugs.

Figure 4A:
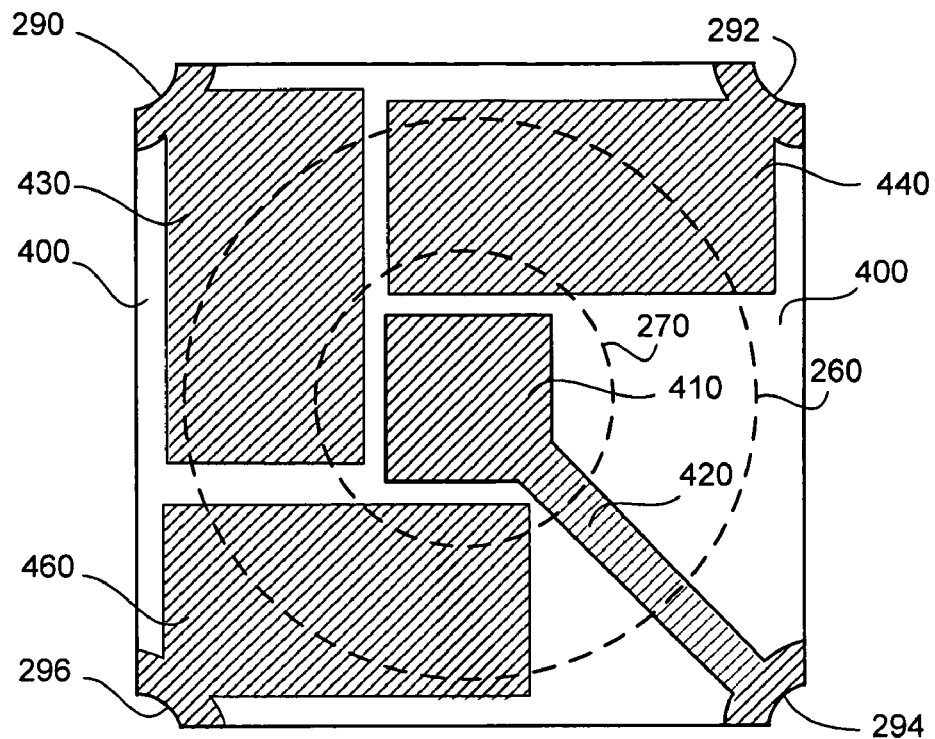
FIGS. 4A and 4B are exemplary metallization patterns for a top surface of a thermally conducting layer of an LED package according to embodiments of the present disclosure.

FIG. 4A illustrates an exemplary metallization pattern for the top surface 400 of thermal conduction layer 230 of the LED package 200 of FIGs. 2 and 3. It can be seen that a generally square central pad 410 is connected by a trace 420 to one of the four partial vias (290, 292, 294, and 296), and partial via 294 particularly in FIG. 4A. Nickel and tungsten are exemplary metals for the metallization. The bottom surface of the LED die 240 is bonded, for example by solder, a thermally and electrically conductive adhesive, or a thermally conductive and electrically non-conductive adhesive, to the central pad 410.

The central pad 410 is surrounded on three sides by three bonding pads 430, 440, and 460, each connected to one of the remaining three partial vias 290, 292, and 296. An electrical contact (not shown) on the top surface of the LED die 240 is wire bonded to one of these three bonding pads 430, 440, and 460 where exposed on the floor of the cavity 250.(i.e., within the circle 270). The four partial vias 290, 292, 294, and 296 connect the bonding pads 430, 440, and 460 and the central pad 410 to external electrical contacts (not shown) on either the top of layer 210 or the bottom of layer 230, or both. These external electrical contacts provide leads to a power source on a circuit board. It can be seen from FIGs. 2-4 that after the package 200 is fully assembled most of the metallization pattern shown in FIG. 4A is sandwiched between layers 230 and 220 and hidden from view.

In the embodiment shown above in FIG. 4A, the central pad 410 serves both as an electrical connector and a thermal bonding pad between the LED die 240 and the top surface 400 of the thermal conduction layer 230. To facilitate electrical connection, the LED die 240 may be either directly bonded to the central pad 410 or attached thereto using an electrically conductive adhesive. In this disclosure, an adhesive is considered to be electrically conductive if it has a volume resistivity less than 1×10-2 ohm-meter. For better performance, an electrically conductive adhesive desirably should have a volume resistivity less than 1×10-4ohm-meter. It should be understood, however, that in some embodiments the central pad 410 serves as a thermal bonding pad but not as an electrical connector, as described elsewhere herein. In such embodiments, the central pad 410 is not connected to one of the partial vias 290, 292, 294, and 296. Instead, all partial vias 290, 292 296, and 294 are connected to a respective pad (such as the bonding pads 430, 440, and 460 and the central pad 410).

It will be appreciated that the arrangement of the bonding pads 430, 440, and 460 around the central pad 410 allows the package 200 to be used with different types of LED dies 240 that require different bonding pad arrangements. For example, a first type of LED die 240 may make electrical connections to the central pad 410 and bonding pad 430, while a second type of LED die 240 may make electrical connections to the central pad 410 and bonding pad 440. In those embodiments in which the central pad 410 is a thermal bonding pad but not an electrical bonding pad, a third type of LED die 240 may make electrical connections to bonding pads 430 and 460, for example. It will be appreciated, therefore, that different types of LED dies 240 can utilize different subsets of the bonding pads. Thus, the package 200 is said to be universal to more than one type of LED die 240.

Figure 4B:
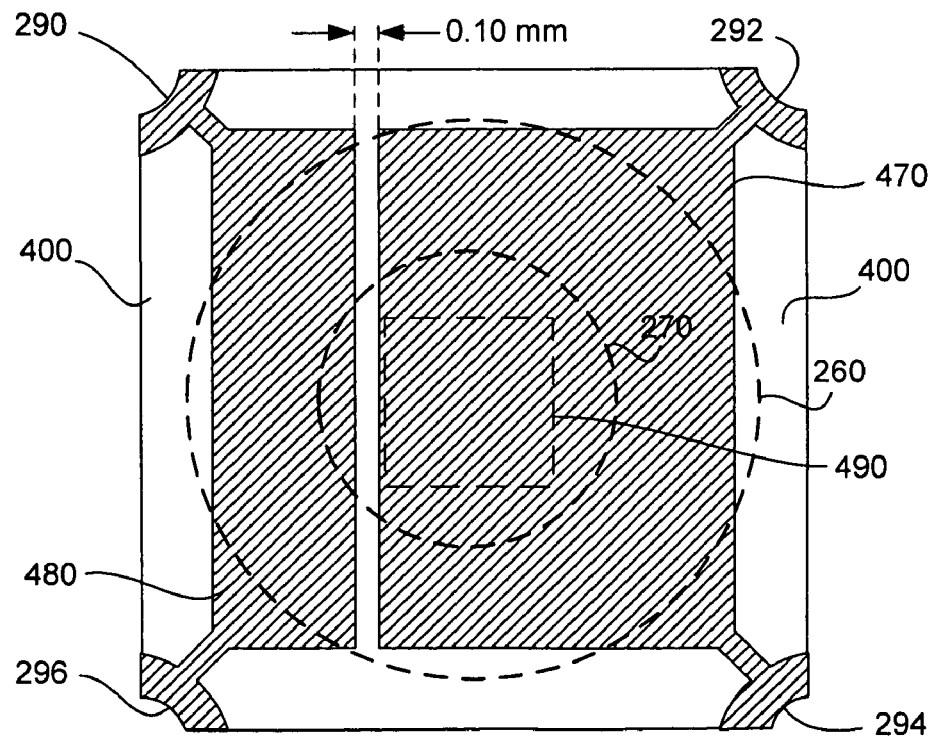

FIG. 4B illustrates another exemplary metallization pattern for the top surface 400 of thermal conduction layer 230 of the LED package 200 of FIGs. 2 and 3. In this embodiment a first pad 470 is connected to two partial vias 292, 294, and a second pad 480 is connected to the other two partial vias 290, 296. An exemplary spacing between the first and second pads 470 and 480 is 0.10 mm. Nickel, tungsten, and silver are exemplary metals for the metallization. In some embodiments, silver is coated over another metal, such as nickel. Line 490 indicates where the bottom surface of the LED die 240 is bonded to the first pad 470. One benefit of the exemplary metallization pattern of FIG. 4B, compared to the metallization pattern shown in FIG. 4A, is that a greater area of the floor of the cavity within the inner diameter 270 is metallized, which serves to reflect a greater amount of light upward and out of the package.

Figure 5:
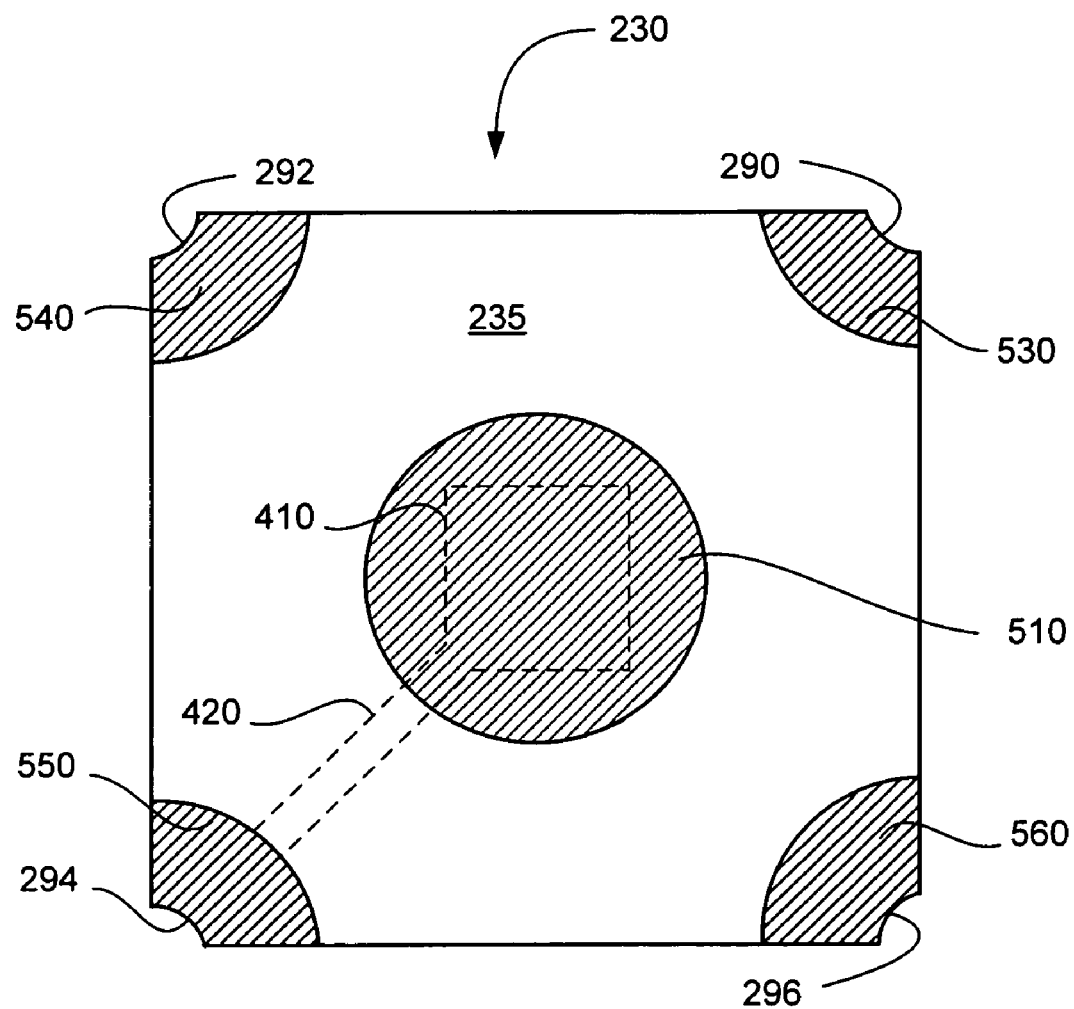
FIG. 5 is an exemplary metallization pattern for the bottom surface of a thermally conducting layer of an LED package according to an embodiment of the present disclosure.

FIG. 5 illustrates an exemplary metallization pattern for the bottom surface 235 of the thermal conduction layer 230. In this embodiment, a centrally located pad 510 provides a thermal path from the bottom surface 235 of thermal conduction layer 230 to a substrate (not shown) to which the package 200 is attached. The substrate can include a heat sink. The pad 510 is circular or square in some embodiments, but is not limited to any particular shape.

Each of the four partial vias 290, 292, 294, and 296 at the corners of the package 200 connect to one of the separate semi-circular electrical contacts 530, 540, 550, and 560, respectively. One of the four semi-circular electrical contacts, 550 in this particular embodiment, is connected through one of the four partial vias (294 in this case) and trace 420, as shown in FIG. 4A, to the central pad 410, while the other three semi-circular electrical contacts (530, 540, and 560 in this embodiment) connect to the three bonding pads 430, 440, and 460, respectively. Trace 420 and central pad 410 are shown in dotted line in FIG. 5 to indicate that they are on the opposite (top) surface of the thermal conduction layer 230. Thus, when attached to the substrate, the centrally located pad 510 is soldered (or otherwise bonded, such as with a thermally conductive epoxy) to the substrate for heat dissipation and two of the four semi- circular electrical contacts 530, 540, 550, and 560 are connected to electrical contacts on the substrate to provide an electrical path through the LED package 200 and to the LED die 240. One of the two semi-circular electrical contacts (550 in this embodiment) connects through the central pad 410 to the bottom of the LED die 240, while the other (any one of 530, 540, and 560) is connected through its respective side bonding pad (430, 440, and 460) to the top of the LED die 240 by a wire bond (not shown). The particular semi-circular electrical contact 530, 540, or 560 that is used to connect to the LED die 240 is determined according to the characteristics and the requirements of the particular LED die 240.

It will be understood that by having an arrangement of several bonding pads in a number of different locations enables the same package to be used with different LED designs. Thus, an LED from one manufacturer may be bonded to one set of bonding pads while an LED from another manufacturer may be bonded to another set of bonding pads. In this respect the package is universal to different LEDs from different sources. Further still, the design of the package of the present invention allows for flexible and simple processes for attaching LEDs to the packages.

In alternative embodiments, the top surface 280 of the top body layer 210 has a metallization pattern to provide electrical contacts rather than the bottom surface of the thermal conduction layer 230. Each of the partial vias 290, 292, 294, and 296 at the corners and sides of the LED package 200 connect to a separate electrical contact on the top surface 140 of the top body layer 210. In these embodiments wire bonds to the electrical contacts on the top surface or 140 of the top body layer 210 connect the LED package 200 to a power source or a circuit board. Locating the electrical contacts on the top of the package 200 rather than the bottom provides a greater area of contact between the bottom surface 235 and the substrate for even greater heat dissipation. The LED package 200 in these embodiments can be bonded to a substrate, for example, by solder or thermally conductive epoxy. The bond does not have to be electrically conductive.

It will be appreciated that the packages of the present disclosure provide improved heat dissipation in several ways, some of which are listed as follows. In some embodiments, the use of a material having superior thermal conductivity for the thermal conduction layer 230 improves heat dissipation. In other embodiments, the accommodation for an electrically nonconductive material for thermal conducting makes it possible to use unconventional thermally conductive materials, for example AlN ceramic, to form the thermally conducting layer. In other embodiments, optimizing the thickness of the thermal the conducting layer 230 further improves heat dissipation. In still other embodiments, providing a large area of contact between the bottom surface 235 of thermal conduction layer 230 and the substrate to which it attaches can further improve heat dissipation. In some embodiments, the packages of the present disclosure also direct a greater percentage of light out of the package, both reducing the heating of the package from absorbed light and increasing the light production efficiency.

Because of the improved heat dissipation, exemplary packages according to the present disclosure exhibit thermal resistances of about 6° C./W at an output greater than 1 watt per package. Exemplary packages according to the present disclosure with four LED dice exhibit a thermal resistance of 3° C./W, with outline dimensions of 7 mm×7 mm×1 mm. The present disclosure also makes highly compact LED packaging possible. In some exemplary packages, the square LED package has a width and length of about 4.4 mm and a thickness of about 1 mm (with thicknesses of about 0.5 mm, 0.1 mm and 0.3 mm for the top body layer, the intermediate body layer and the thermally conducting layer, respectively). The present disclosure therefore enables high-power LEDs to be used in higher-temperature environments, such as in automotive engine compartments, as well as in applications where high-temperature components cannot be tolerated, such as in dental applications, for example, in an illumination device used to cure dental cements.

The features disclosed in the present disclosure can be combined with other techniques of LED packaging. For example, the package of the present disclosure can further use encapsulating techniques as described in the U.S. patent application Ser. No. 11/036,559, entitled "Light Emitting Device with a Thermal Insulating and Refractive Index Matching Material," filed on Jan. 13, 2005, which is incorporated by reference herein.

Figure 6A:
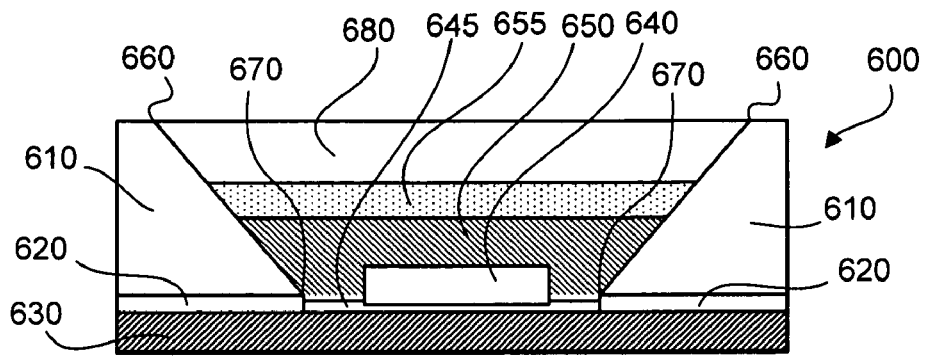
FIGS. 6A-6C are cross-sectional views of several exemplary embodiments of an LED package of the present disclosure.

FIG. 6A is a cross-sectional view of another exemplary embodiment of the LED package of the present disclosure. From top to bottom, the LED package 600 comprises layers 610, 620, and 630. Similar to the LED package 200 of FIG. 2, layer 610 is a top body layer, layer 620 is an intermediate body layer, and layer 630 is a thermal conducting layer. An LED 640 mounted to a top surface of thermal conducting layer 630 through an LED die attach layer 645. A thermal insulation layer 650 and a luminescent layer 655 are placed in a tapered cavity having the shape of an inverted cone. The cavity has a side wall extending from a top rim 660 to a bottom rim 670. The LED package 600 also has an auxiliary member 680 enclosing the package from the top. The auxiliary member 680 is optional and can be, for example, an optical lens for focusing the light emitted from the LED package 600. The auxiliary member 680 can also serve as a protective capping layer.

It can be seen that the thermal insulation layer 650 is disposed between the luminescent layer 655 and a top surface of the LED die 640. The thermal insulation layer 650 at least partially protects the luminescent material in the luminescent layer 655 from the heat produced by the LED die 640, thus better maintaining thermal properties, such as light conversion efficiency and output wavelength, at or near optimal values far longer than under the prior art. The thermal insulating material of thermal insulation layer 650 can also be a material with an index of refraction chosen to closely match that of the material of the LED die 640.

The use of a thermal insulating material to protect the luminescent material within the encapsulant member from the heat produced by the LED is made particularly effective when applied in the LED packages of the present disclosure. It will be appreciated that prior art light emitting devices do not include thermal insulation to protect phosphors from the heat generated by the LEDs because heat dissipation has been an overriding concern in such devices. Put another way, designers of prior art light emitting devices have sought to dissipate as much heat as possible through the phosphor-containing layers (e.g., luminescent layer 655) because to do otherwise would require too much heat dissipation through the remainder of the light emitting device. However, where the thermally conducting layer 630 provides sufficient heat conduction, it is no longer necessary to conduct heat through the phosphor-containing luminescent layer 655, and thermal insulation can be introduced to shield the luminescent materials.

The thermal insulation layer 650 is preferably transparent, or nearly so, to the light emitted from the LED die 640. The thermal insulating material is therefore preferably transparent to at least one wavelength emitted by the LED die 640. The wavelengths emitted by various available LEDs extend over a wide spectrum, including both visible and invisible light, depending on the type of the LED. The wavelengths of common LEDs is generally in a range of about 200 nm-2000 nm, namely from the infrared to the ultraviolet.

In order to effectively thermally insulate the luminescent layer 655, the thermal insulating material of the thermal insulation layer 650 should have a low thermal conductivity, desirably with a thermal conductivity of no more than 0.5 watt per meter per degree Kelvin (W/m° K.), and more desirably with a thermal conductivity of no more than 0.15 W/m° K. The thermal insulating material for the thermal insulation layer 650 desirably also has high heat resistance, preferably with a glass transition temperature, $T_g$, above 170° C., and more preferably a glass transition temperature above 250° C. Furthermore, in order to have good thermal compatibility and mechanical compatibility between the thermal insulation layer 650 and other components, especially the LED die 640, which are typically semiconductor materials, the thermal insulating material desirably has a coefficient of thermal expansion no greater than 100 ppm/° C., and more desirably a coefficient of thermal expansion no greater than 30 ppm/° C.

Luminescent materials suitable for the present invention include both fluorescent materials (phosphors) and phosphorescent materials. Phosphors are particularly useful for LED-based white light sources. Common phosphors for these purposes include Yttrium Aluminum Garnet (YAG) materials, Terbium Aluminum Garnet (TAG) materials, ZnSeS+materials, and Silicon Aluminum Oxynitride (SiAlON) materials (such as α-SiAlON).

The present invention also provides a light emitting device comprising a package of the invention configured with an LED die and a luminescent material. In one embodiment, light emitting device produces white light based on a monochromatic LED. This can be done, for example, by using a visible light LED and a compensatory phosphor, or by using an invisible light LED together with RGB phosphors. For instance, a blue LED-based white light source produces white light by using a blue light LED and a phosphor that produces a yellowish light.

Figure 6B:
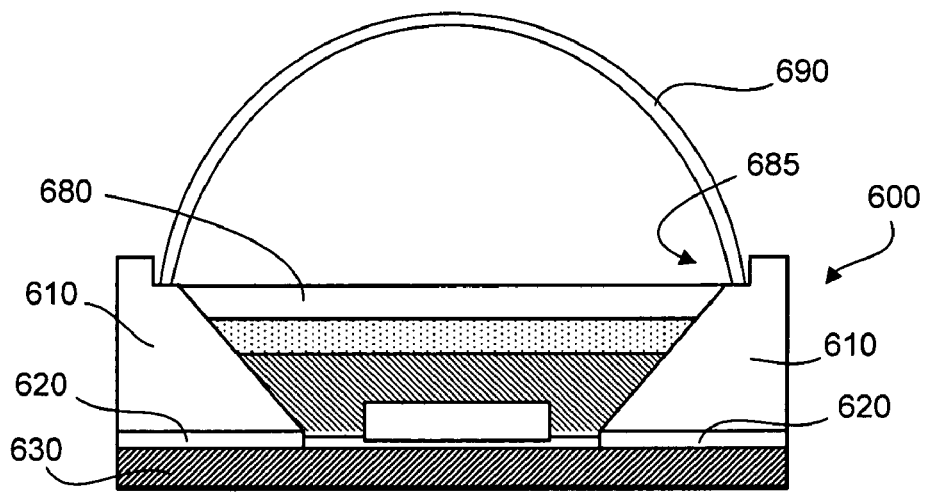
Figure 6C:
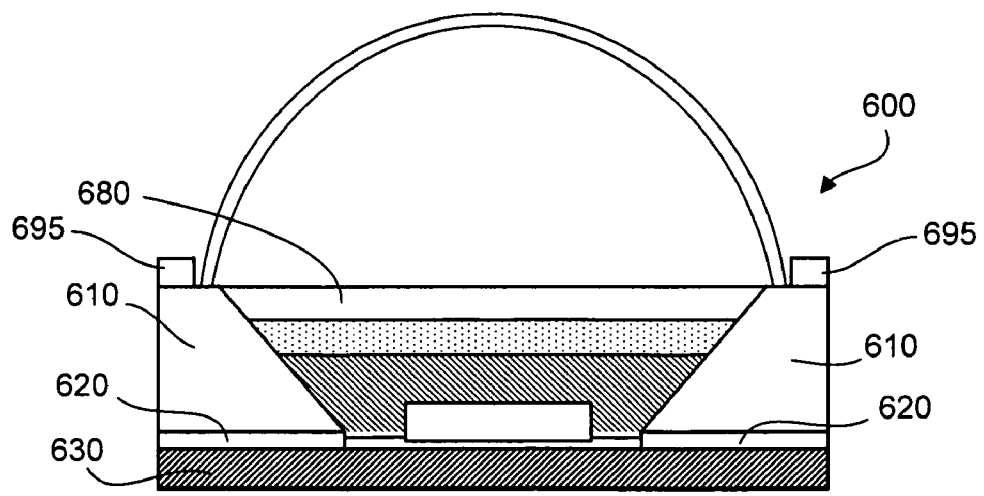

FIGS. 6B and 6C show cross-sections of additional embodiments of the LED package 600. In FIG. 6B the top body layer 610 includes a circular notch 685 to receive a lens 690. The lens 690 can be glass or plastic, for example. The notch 685 beneficially provides a guide that centers the lens 690 over the LED die 640 during assembly. In some of these embodiments, the top body layer 610 comprises a metal such as a copper-tungsten (Cu/W) alloy. The tapered cavity and the notch 685, in some of these embodiments, are formed by a stamping operation. In further embodiments, the intermediate body layer 620 and the thermal conducting layer 630 are also made of alumina.

In FIG. 6C the LED package 600 comprises an alignment layer 695 placed above the top body layer 610. A circular aperture in the alignment layer 695 creates essentially the same guide for the lens 690 as described above with respect to FIG. 6B. The alignment layer 695 can include, for example, metal or ceramic. In those embodiments in which layers 610, 620, and 630 include AlN, the alignment layer 695 can also include AlN.

Figure 7:
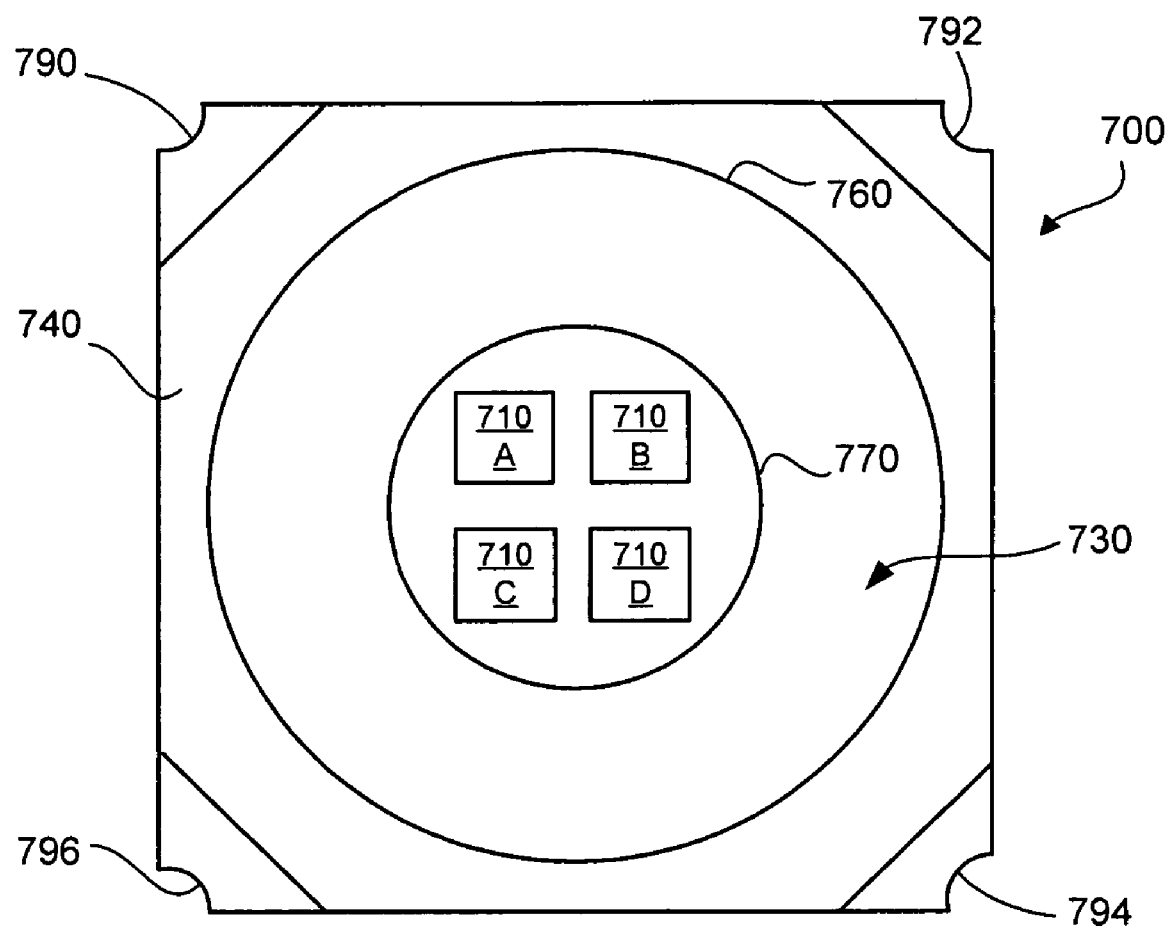
FIG. 7 is a top view of an LED package in accordance with another embodiment of the present disclosure.

The LED package of the present invention, in some embodiments, can support multiple LED dies within a single package to further increase the output level and density. FIG. 7 is a top view of an LED package 700 in accordance with another embodiment of the present disclosure. The LED package 700 is similar to the LED package 200 in FIGS. 2-5, except that the LED package 700 contains multiple LEDs (710A, 710B, 710C, and 710D) instead of a single LED. The top view of the LED package 700 shows the cavity 730, the top surface 740, the outer diameter 760 and the inner diameter 770 of the cavity 730, and the four partial vias 790, 792, 794, and 796. In the particular embodiment shown in FIG. 7, the LED package 700 includes four LEDs 710A, 710B, 710C, and 710D, although in principle any other number of LEDs may be arranged in a package of the present invention. The four LEDs 710A, 710B, 710C, and 710D can be the same or different, and in some embodiments are independently operable. For example, the multiple LEDs (710A, 710B, 710C and 710D) may be selectively operable and may be operable in any combination. The LED package 700 is intended to provide an LED package capable of producing an output of 1-15 watts with a thermal resistance of 3° C./W, but is not limited thereto.

Figure 9:
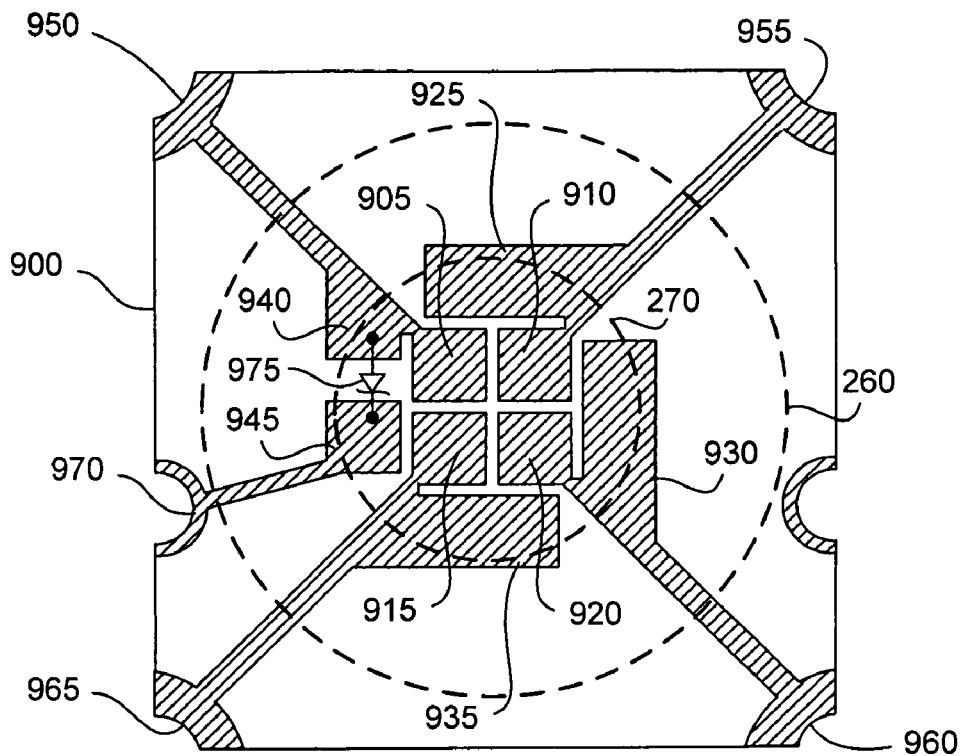
FIG. 9 is another exemplary metallization pattern for a top surface of a thermally conducting layer of an LED package according to another embodiment of the present disclosure.

FIG. 9 illustrates an exemplary metallization pattern for a top surface of a thermal conduction layer 900 of the LED package 700 of FIG. 7. It can be seen that four generally square central pads 905, 910, 915, and 920 are arranged in a square array. The LEDs 710A-D (FIG. 7) mount to the central pads 905, 910, 915, and 920. The central pads 905, 910, 915, and 920 are surrounded by five bonding pads 925, 930, 935, 940, and 945. In this embodiment, each of the central pads 905, 910, 915, and 920 is connected by a trace to one of the bonding pads 925, 930, 935, and 940 and to one metallized partial via 950, 955, 960, and 965. The fifth bonding pad 945 is connected by a trace to a fifth partial via 970. The bottom surface of the LED die 240 is bonded, for example by solder, or a thermally and electrically conductive adhesive.

In one embodiment, LED 710C (FIG. 7) is disposed on central pad 915 and a contact on the top surface of the LED 710C is wire bonded to bonding pad 945. Likewise, LED 710D (FIG. 7) is disposed on central pad 920 and a contact on the top surface of the LED 710D is wire bonded to bonding pad 935; LED 710B (FIG. 7) is disposed on central pad 910 and a contact on the top surface of the LED 710B is wire bonded to bonding pad 930; and LED 710A (FIG. 7) is disposed on central pad 905 and a contact on the top surface of the LED 710A is wire bonded to bonding pad 925. In this embodiment bonding pad 945 serves as a ground. To activate LED 710C a sufficient voltage is applied to the partial via 965. To activate LEDs 710C and 710D a sufficient voltage is applied to the partial via 960. To activate all four LEDs 710A-D a sufficient voltage is applied to the partial via 950. In some embodiments an ESD protection device 975 is connected between bonding pads 940 and 945.

As in some of the embodiments described above, in further embodiments the central pads 905, 910, 915, and 920 are thermal bonding pads and not electrical bonding pads. In these embodiments, the central pads 905, 910, 915, and 920 are not connected by traces to the bonding pads 925, 930, 935, and 940 and to the partial via 950, 955, 960, and 965. In some of these embodiments two contacts on LED 710A are wire bonded to bonding pads 940 and 925, LED 710B is wire bonded to bonding pads 925 and 930, LED 710D is wire bonded to bonding pads 930 and 935, and LED 710C is wire bonded to bonding pads 935 and 945. For greater operative independence of the LEDs 710A-D bonding pads 925, 930, 935, 940, and 945 can be made smaller to accommodate still further bonding pads within the inner diameter 270. These further bonding pads can be electrically connected to additional partial vias at the edges of the LED package 700 (FIG. 7). It will be appreciated that in those embodiments in which the bonding pads for bonding the LED dice are not electrically conductive, the bonding pads can be merely regions on the floor of the cavity rather than a patterned layer of some material on the floor of the cavity. In other words, the die attach layer 245 bonds the LED dice directly to the floor of the cavity in the bonding pad region.

Figure 10:
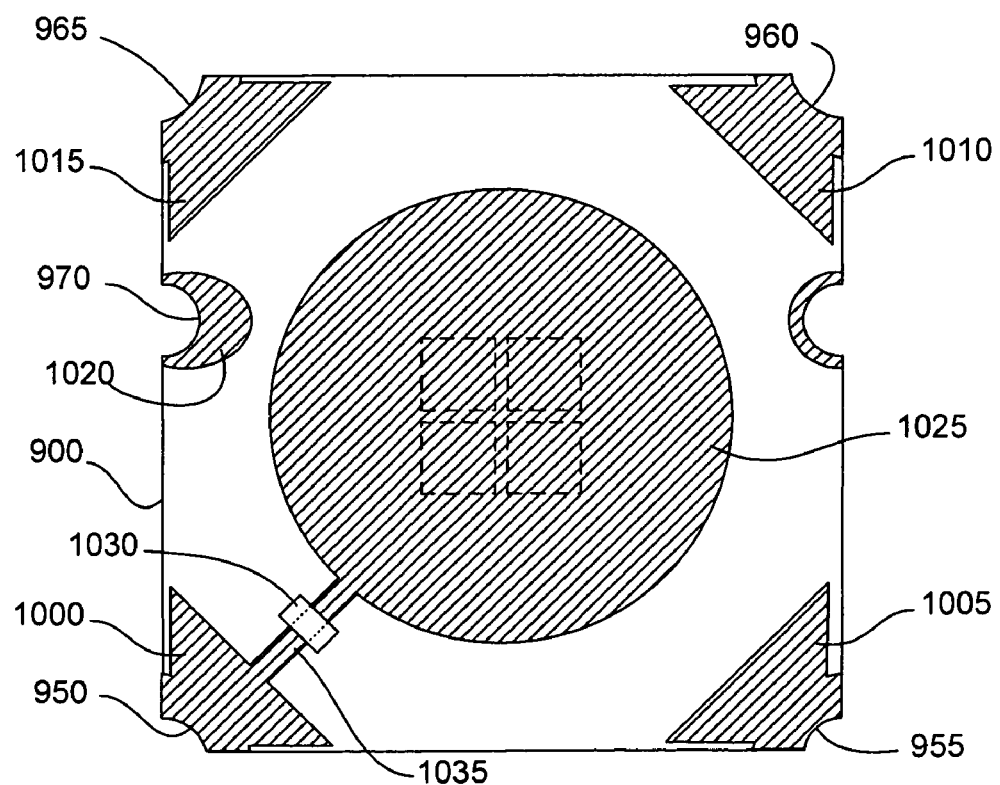
FIG. 10 is another exemplary metallization pattern for a bottom surface of a thermally conducting layer of an LED package according to another embodiment of the present disclosure.

FIG. 10 illustrates an exemplary metallization pattern for a bottom surface of the thermal conduction layer 900 of the LED package 700 of FIG. 7. This metallization pattern can be used where the bottom surface of the LED package 700 is used to make electrical connections to a substrate, for example, with an array of solder balls. Thus, for example, each of the partial vias 950, 955, 960, 965, and 970 connect to contacts 1000, 1005, 1010, 1015, and 1020. An additional central contact 1025 helps improve thermal contact with the substrate. The central contact 1025 optionally can also serve as an electrical contact. In these embodiments, a small patch 1030 of AlN, or another material, can be placed over the trace 1035 between the central contact 1025 and the partial via 950 to prevent solder from flowing along the trace 1035 during soldering.

Figure 11:
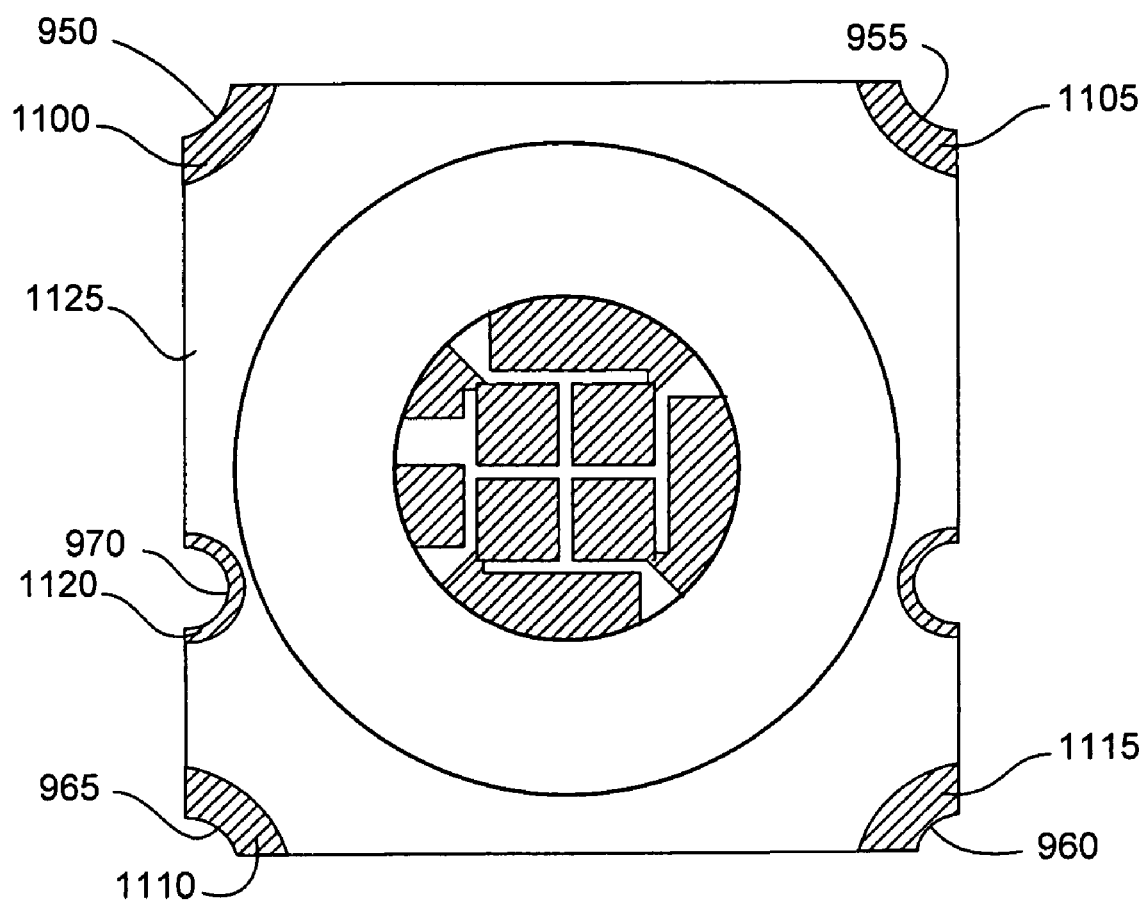
FIG. 11 is a top view of an LED package showing an exemplary metallization pattern on a top surface of the body of the package, according to an embodiment of the present disclosure.

In other embodiments, as shown in FIG. 11, the partial vias 950, 955, 960, 965, and 970 are electrically connected to contacts 1100, 1105, 1110, 1115, and 1120 on a top surface of a top body layer 1125 of the LED package 700 (FIG. 7). In these embodiments, the contacts 1100, 1105, 1110, 1115, and 1120 are mounted to bonding pads on a flexible circuit board. In these embodiments, the bottom of the package is free of bonding pads and is used for thermal path only. These arrangements significantly improve thermal performance for small packages.

3. Method of Fabrication

Methods are disclosed for fabricating a layered LED package as described with reference to FIGS. 2-7. The methods vary depending upon the materials selected for each layer, specific designs, such as the pattern of metallization and the location and routing of the electrical connections, and applications of the LED package. In those embodiments shown in FIGS. 2-5 and in which all three layers 210, 220, and 230 are made of a ceramic, for example, the layers 210, 220, and 230 can be manufactured separately, stacked together, and co-fired (sintered) to bond the layers 210, 220, and 230 together. When non-ceramic materials are used for layers 210 and 220, however, the layers 210 and 220 can be bonded together with suitable adhesives or solders.

Figure 8:
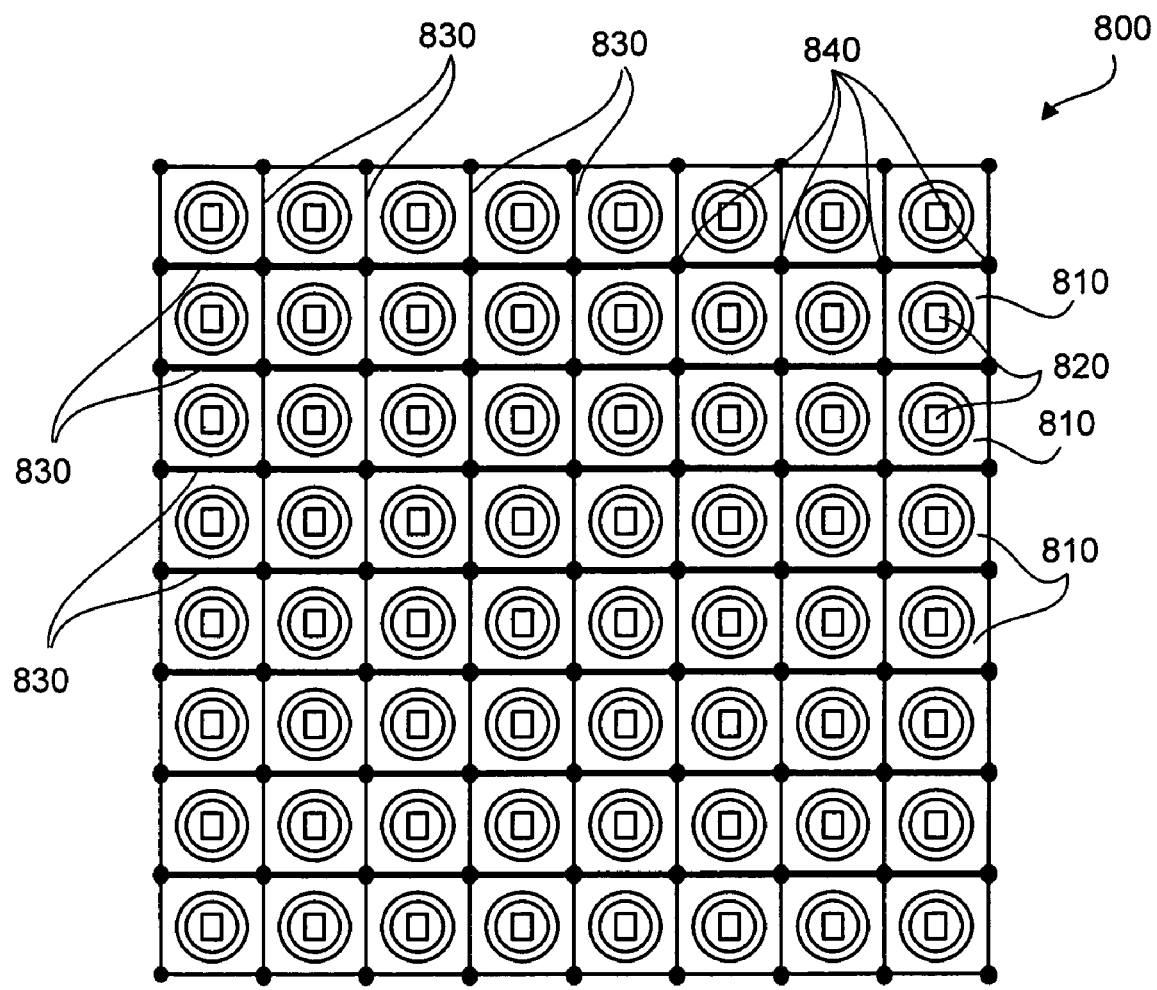
FIG. 8 is a top view of a plurality of LED packages manufactured in parallel during an exemplary embodiment of a fabrication process.

In one embodiment of the method of the invention, multiple LED packages are formed together in a batch process in which the individual LED packages are fabricated in parallel as a panel 800 from which individual LED packages can later be separated. FIG. 8 shows a top view of a plurality of LED packages 810 manufactured in parallel during an exemplary embodiment of a fabrication process. In this embodiment, the LED packages 810, which can be fabricated to include LED dies 820, are assembled in a square grid pattern separated by snap lines 830. Rows or columns of the packages 810 can be snapped apart along the snap lines 830, and then further sub-divided into individual LED packages 810. According to this embodiment, each of the top body layer (e.g., 210), the intermediate body layer (e.g., 220) and the thermally conducting layer (e.g. 230) for the plurality of LED packages 810 is produced as a whole piece, and each layer is independently fabricated as a sheet and then bonded together. LED dies 820 can be added to the grid of LED packages 810 before the grid is separated into individual LED packages 810.

Easily fractured materials, such as ceramics, are particularly suited for the above described embodiment. Separating the grid into the individual LED packages 810 would be difficult if a metal, such as copper, is used to form a bottom plate for heat dissipation. If a material that is not easily fractured is used for any of the three layers (e.g., the top body layer 210, the intermediate body layer 220 and the thermal conduction layer 230), it may be necessary to prepare such layers along the snap lines 830 with deep grooves or perforations to facilitate separation.

The grid in FIG. 8 also includes an array of vias (holes) 840 along the snap lines 830. Each via 840 is shared by four neighboring LED packages 810, except for those located at an edge or corner which would be shared by either one or two neighboring LED packages 810. After the individual LED packages 810 are separated along the snap lines 830, the vias 840 are separated apart to become partial vias (e.g., 290, 292, 294 and 296).

To produce a thermally conducting layer (e.g., 230 or 630) using a ceramic material according to a particular embodiment, for example, a ceramic layer of a material such as AlN is prepared with a square array of vias 840 disposed therethrough. The vias 840 sit at the intersections of the snap lines 830 in FIG. 8. Ultimately, when the LED packages 810 are separated from one another, each via 840 becomes a partial via (e.g., 290, 292, 294, and 296) of four different neighboring packages 810. The top and bottom surfaces of the ceramic layer are patterned, in exemplary embodiments, with metallization as shown in FIGS. 4 and 5. Patterning can be achieved, for example, by plating. Suitable metals for the metallization include tungsten and nickel. These patterns are repeated for each package 810 that will be produced.

Various patterns of metallization may be used to achieve different effects and to suit the different requirements of the LED dies 820. In some embodiments, for example, the central pad (e.g., the central pad 410 in FIG. 5) serves both as a thermal contact and an electrical contact. In these embodiments, the central pad on the top surface of the thermally conducting layer (230) is connected by a trace (420) to one of the partial vias (294) so that an electrical connection extends from the central pad to the opposite surface of the thermally conducting layer. If desirable, the electrical connection may be further extended to the central pad (510). In these embodiments, a small patch of AlN, or another material, can be placed over the trace (420) between the central pad and the partial via to prevent solder from flowing along the trace during soldering.

To produce an intermediate body layer (e.g., layer 220), according to this embodiment, a layer of a material such as AlN is prepared with a square array of vias disposed therethrough. The square array of vias matches the square array of vias in the thermally conducting layer. Additionally, a square array of apertures is defined in the layer such that each aperture is centered in a square defined by four adjacent vias. These apertures correspond to the inner diameter of the cavity (e.g., the inner diameter 270 in FIGS. 2-5) of the respective LED package.

To produce a top body layer (e.g., layer 210), according to this embodiment, a layer of a material such as AlN is prepared with a square array of vias disposed therethrough. The square array of vias matches the square arrays in the thermally conducting layer and the intermediate body layer. Additionally, a square array of apertures is defined in the layer such that each aperture is centered in a square defined by four adjacent vias. The array of apertures on the top body layer match the array of apertures on the intermediate body layer but have a different diameter. These apertures are preferably inclined or otherwise shaped to provide a sidewall as discussed above with respect to FIGS. 1-3. Specifically, in a preferred embodiment, each inclined aperture has a top rim that corresponds to the outer diameter (e.g., the outer diameter 260 in FIGS. 2-5) of the cavity in the respective LED package, and a bottom rim that corresponds to the inner diameter (e.g., the inner diameter 270 in FIGS. 2-5) of the cavity in the respective LED package 810. The top body layer is then metallized to provide sidewall metallization and any electrical contacts for the top surface. For the embodiments that do not require electrical contacts for the top surface of the top body layer, no electrical contacts are formed on the top surface.

Once the thermally conducting layer, the intermediate layer and the top body layer are individually prepared, the three layers are brought together in an assembly, the vias in each layer are aligned, and the three layers are bonded together. As noted above, where all three layers are ceramic the assembly can be co-fired, else the layers can be bonded together with a suitable adhesive or solder. In the latter embodiments, the adhesive can serve to electrically insulate the metallization on the top surface of the thermally conducting layer (e.g., metallization pattern shown in FIG. 4A) from an intermediate layer comprising a metal such as copper. Once the layers have been bonded to one another, the vias 840 can be plated to provide electrical connections between metallizations on the various surfaces of the layers.

Although the LED packages 810 can be separated at this point for subsequent fabrication into light emitting devices, it is often desirable to first attach LED dies 820 to form an entire panel 800 of light emitting devices in parallel. To create a panel 800 of light emitting devices, solder flux or a thermally conductive die-attach is dispensed and the LED dies 820 are bonded to the LED packages 810. Then, each LED die 820 is wire bonded to the appropriate bonding pads. Preferably, the cavities of the LED packages 810 are next filled to encapsulate the LED dies 820. In some embodiments this process includes forming a thermally insulating layer over the LED die 820, forming a luminescent layer over the thermally insulating layer, and then forming a lens over the luminescent layer. Finally, the assembly is diced along the snap lines 830. It will be appreciated that the light emitting devices of the present invention can be manufactured with fewer processing steps than prior art devices, in some instances fewer than half as many steps.

To produce an embodiment such as that shown in FIG. 6C, in which a ceramic alignment layer 695 is included, the method described above can be modified so that the alignment layer 695 is co-fired together with the thermally conducting, intermediate, and top body layers. Alternately, a metal alignment layer 695 can be bonded to the top body layer with a suitable adhesive or solder.

In those embodiments that include an alignment mechanism for aligning a lens such as lens 690 in FIGS. 6B and 6C, the lens can be added to the package 810 in a number of different ways. In some embodiments, a vacuum tool is used to pick up a lens and move the lens into position. In other embodiments a number of lenses are held on a strip of tape; a lens on the tape is aligned with the package 810 and a tool presses the lens into the guide to transfer the lens from the tape and to the package 810. It will be appreciated that lens transfer by vacuum tool or from tape can be achieved either before or after the LED packages 810 are separated from one another.

In an exemplary batch process that can be performed before the LED packages 810 are separated from the panel 800, the lenses are formed by injection molding. In this process a mold having an array of lens-shaped wells is sealed to the panel 800 so that one well is aligned with each of the packages 810. A suitable plastic is injected into the mold to fill the wells. The plastic is then cured to form the lenses. In another exemplary batch process, the lenses are formed by mask printing.

In the foregoing specification, the present invention is described with reference to specific embodiments thereof, but those skilled in the art will recognize that the present disclosure is not limited thereto. Various features and aspects of the above-described invention may be used individually or jointly. Further, the present invention can be utilized in any number of environments and applications beyond those described herein without departing from the broader spirit and scope of the specification. The specification and drawings are, accordingly, to be regarded as illustrative rather than restrictive, It will be recognized that the terms "comprising," "including," and "having," as used herein, are specifically intended to be read as open-ended terms of art. It will be further recognized that "LED" and "LED die" are used interchangeably herein.

what is claimed is:

1. A package for multiple LEDs comprising:
    a body including
        top and bottom surfaces;
        a cavity extending from the top surface towards the bottom surface and having a floor that is substantially parallel to the bottom surface;
        a thermally conducting material disposed between the floor and the bottom surface;
        a plurality of LED bonding pads disposed on the floor; and
        a plurality of electrical bonding pads disposed on the floor proximate to the LED bonding pads and in electrical communication with a plurality of electrical contacts disposed on a surface of the body, the plurality of electrical bonding pads in electrical communication with the plurality of electrical contacts through a plurality of vias and at least one of the plurality of vias consisting of a partial via.

2. The package of claim 1 wherein the thermally conducting material comprises a ceramic.

3. The package of claim 1 wherein the plurality of electrical contacts are disposed on the bottom surface of the body.

4. The package of claim 1 further comprising an ESD protection device coupled between two of the plurality of electrical bonding pads.

5. A package for multiple LED's and for attachment to a substrate comprising:
    a top body layer;
    a cavity disposed through the top body layer and having a floor for bonding to the multiple LED's;
    a thermal conduction layer bonded to the top body layer and having a top surface forming the floor of the cavity and a bottom surface, the thermal conduction layer including a thermally conducting ceramic material disposed between the floor and the bottom surface;
    a plurality of LED bonding pads in direct contact with the floor and configured to bond to the multiple LED's; and
    a plurality of electrical bonding pads in direct contact with the floor, proximate to the LED bonding pads, and in electrical communication with a plurality of electrical contacts disposed on a surface of the body.

6. The package of claim 5 further comprising a central pad disposed on the bottom surface of the thermal conduction layer and having a continuously curved periphery without a corner.

7. The package of claim 6 wherein at least one of the electrical contacts is in electrical communication with the central pad.

8. The package of claim 5 wherein the plurality of electrical contacts are disposed on the bottom surface of the thermal conduction layer.

9. The package of claim 5 further comprising a luminescent layer disposed over the LED dies and a thermal insulation layer disposed between the luminescent layer and the LED dies.

10. The package of claim 5 further comprising a via configured to provide electrical communication between at least one of electrical bonding pads and at least one of the plurality of electrical contacts wherein the via consists of a partial via.

11. The light emitting device of claim 5 wherein the plurality of LED bonding pads are electrically conductive.

* * * * *

UNITED STATES PATENT AND TRADEMARK OFFICE
CERTIFICATE OF CORRECTION

| | | |
|---|---|---|
| PATENT NO. | : 7,473,933 B2 | Page 1 of 1 |
| APPLICATION NO. | : 11/259842 | |
| DATED | : January 6, 2009 | |
| INVENTOR(S) | : Xiantao Yan | |

It is certified that error appears in the above-identified patent and that said Letters Patent is hereby corrected as shown below:

In the Claims

Col. 18, line 8, in claim 5, please insert the following phrase after the preamble and immediately before "a top body layer":

--a body including--

Signed and Sealed this
Fourth Day of March, 2014

Michelle K. Lee
*Deputy Director of the United States Patent and Trademark Office*